US009689679B2

(12) United States Patent
Budker et al.

(10) Patent No.: US 9,689,679 B2
(45) Date of Patent: Jun. 27, 2017

(54) GYROSCOPES BASED ON NITROGEN-VACANCY CENTERS IN DIAMOND

(71) Applicant: THE REGENTS OF THE UNIVERSITY OF CALIFORNIA, Oakland, CA (US)

(72) Inventors: Dmitry Budker, El Cerrito, CA (US); Micah Ledbetter, Oakland, CA (US); Kasper Jensen, Berkeley, CA (US); Andrey Jarmola, Berkeley, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 455 days.

(21) Appl. No.: 14/504,720

(22) Filed: Oct. 2, 2014

(65) Prior Publication Data

US 2015/0090033 A1    Apr. 2, 2015

Related U.S. Application Data

(63) Continuation of application No. PCT/US2013/036435, filed on Apr. 12, 2013.

(60) Provisional application No. 61/624,249, filed on Apr. 13, 2012.

(51) Int. Cl.
  *G01C 19/58* (2006.01)
  *G01C 19/62* (2006.01)
  *G01R 33/46* (2006.01)

(52) U.S. Cl.
  CPC ............ *G01C 19/62* (2013.01); *G01C 19/58* (2013.01); *G01R 33/46* (2013.01)

(58) Field of Classification Search
  CPC .................... G01C 19/58; G01C 19/62
  See application file for complete search history.

(56) References Cited

U.S. PATENT DOCUMENTS

| 4,157,495 A * | 6/1979 | Grover .............. G01R 33/26 324/302 |
| 2010/0321117 A1 | 12/2010 | Gan |
| 2011/0062957 A1 | 3/2011 | Fu et al. |

(Continued)

FOREIGN PATENT DOCUMENTS

| WO | 2009073740 A2 | 6/2009 |
| WO | 2010010352 A1 | 1/2010 |

OTHER PUBLICATIONS

Pham et al., "Magnetic Field Imaging with Nitrogen-Vacancy Ensembles", New Journal of Physics 13, Apr. 28, 2011, pp. 1-13.

(Continued)

*Primary Examiner* — John Chapman, Jr.
(74) *Attorney, Agent, or Firm* — O'Banion & Ritchey LLP; John P. O'Banion

(57) ABSTRACT

A solid-state gyroscope apparatus based on ensembles of negatively charged nitrogen-vacancy (NV⁻) centers in diamond and methods of detection are provided. In one method, rotation of the NV⁻ symmetry axis will induce Berry phase shifts in the NV⁻ electronic ground-state coherences proportional to the solid angle subtended by the symmetry axis. A second method uses a modified Ramsey scheme where Berry phase shifts in the $^{14}$N hyperfine sublevels are employed.

21 Claims, 7 Drawing Sheets

(56) References Cited

U.S. PATENT DOCUMENTS

2015/0192532 A1* 7/2015 Clevenson ............ G01R 33/323
                       324/304

OTHER PUBLICATIONS

Korea Intellectual Property Office (KIPO), International Search Report and Written Opinion, PCT/US2013/036435, Jan. 17, 2014 (pp. 1-9) with claims searched (pp. 10-13).

* cited by examiner

GYROSCOPES BASED ON NITROGEN-VACANCY CENTERS IN DIAMOND

CROSS-REFERENCE TO RELATED APPLICATIONS

This application is a 35 U.S.C. §111(a) continuation of PCT international application number PCT/US2013/036435 filed on Apr. 12, 2013, incorporated herein by reference in its entirety, which claims priority to, and the benefit of, U.S. provisional patent application Ser. No. 61/624,249 filed on Apr. 13, 2012, incorporated herein by reference in its entirety. Priority is claimed to each of the foregoing applications.

The above-referenced PCT international application was published as PCT International Publication No. WO 2014/011286 on Jan. 16, 2014 and republished on Mar. 20, 2014, which publications are incorporated herein by reference in their entireties.

STATEMENT REGARDING FEDERALLY SPONSORED RESEARCH OR DEVELOPMENT

This invention was made with Government support under FA9550-11-1-0270 awarded by the Air Force Office of Scientific Research (AFOSR), and 0855552 awarded by the National Science Foundation (NSF). The Government has certain rights in the invention.

INCORPORATION-BY-REFERENCE OF COMPUTER PROGRAM APPENDIX

Not Applicable

BACKGROUND OF THE INVENTION

1. Field of Invention

This invention pertains generally to inertial sensors including gyroscopes and more particularly gyroscopes based on ensembles of negatively charged nitrogen-vacancy centers in diamonds.

2. Background

Recent decades have seen an increased demand for low cost, accurate and reliable control and navigation systems for land, sea and space vehicles. These systems are typically based on gyroscopes or inertial sensors that can measure precisely changes in the orientation of the vehicle or device as it moves. Such devices also find use in gravity research, for example, in tests of Einstein's equivalence principle or to search for the Lens-Thirring effect, a prediction from general relativity of "framedragging" in the presence of a massive rotating body.

Gyroscopes are physical sensors that detect and measure the angular motion of an object in relation to an internal frame of reference. The gyroscope was named by French physicist, Jean Bernard Leon Foucault, who attempted to demonstrate the rotation of the Earth in 1852.

Early gyroscopes were spinning disks on a central axel inside of a stable frame. The rotor spins on a fixed axis while the frame around the rotating disk can rotate or tilt. The spinning disk resists changes to its axis of rotation. When the axis of the spinning rotor is tilted perpendicularly to the direction of the spin, the axis will precess. Precession keeps the spinning rotor in a vertical orientation while the structure around the rotor tilts with the reference surface. The angle of the rotor axis relative to the reference structure can also be measured.

Another approach includes microelectromechanical systems (MEMS) vibrating mass gyroscopes aimed at creating smaller, more sensitive devices. The vibrating mass approach exploits the exchange of energy between different axes of vibration due to the Coriolis effect. MEMS vibratory gyroscopes measure rotation rate by vibrating a proof-mass and sensing the Coriolis force caused by angular velocity. Vibrating mechanical elements (proof-mass) have no rotating parts that require bearings and they can be easily fabricated using micromachining techniques.

Present state-of-the-art sensors used for navigation in the airline industry are based on the Sagnac effect in fiber-optic bundles, with sensitivities at the level of $2 \times 10^{-8}$ rad $s^{-1}$ $Hz^{-1/2}$. The same effect in large-area ($\sim m^2$) ring lasers has yielded a sensitivity at the level of $2 \times 10^{-10}$ rad $s^{-1}$ $Hz^{-1/2}$. Gyroscopes based on cold atom interferometry have also demonstrated sensitivity in the range of $10^{-9}$ to $10^{-10}$ rad $s^{-1}$ $Hz^{-1/2}$. Noble gas nuclear spins, which feature long coherence times, can also be used to form rotation sensors and have a demonstrated sensitivity of about $3 \times 10^{-7}$ rad $s^{-1}$ $Hz^{-1/2}$. Variations on this scheme yield a projected sensitivity in the range of $10^{-10}$ rad $s^{-1}$ $Hz^{-1/2}$ in an active volume of several cubic centimeters. This concept has been extended to miniaturized versions. Finally, commercially available vibrating microelectromechanical system (MEMS) gyroscopes achieve sensitivities of the order of $2 \times 10^{-4}$ rad $s^{-1}$ $Hz^{-1/2}$. Except for the latter two cases, these sensors rely on large volumes or enclosed areas.

In spite of the sensitivity advantages of MEMS based gyroscopes, they suffer from sensitivity drifts that can arise after a few minutes of operation from temperature variations and noise making them unattractive for several conventional applications. However, to achieve sensitivities that are comparable to MEMS, other systems used as gyroscopes typically require large volumes ($\sim cm^3$), long startup times, as well as large power and space requirements.

Accordingly, there is a need for sensitive and reliable gyroscope systems that are resistant to vibrations, temperature variations and have relatively small size requirements. The present invention satisfies these needs as well as others and is generally an improvement over the art.

SUMMARY OF THE INVENTION

The present invention exploits the geometric-phase effects in diamond to form gyroscopic sensors from high-density ensembles of nitrogen-vacancy ($NV^-$) centers. Key advantages of using nitrogen-vacancy based sensors include their potentially small dimensions and thermal robustness, with the ability to operate ranging from cryogenic temperatures to 600-700 K. It is also possible to observe large geometric phase shifts in single $NV^-$ centers in diamond.

The preferred embodiment of the invention is a solid-state gyroscope based on ensembles of negatively charged nitrogen-vacancy centers in diamonds. In one scheme, rotation of the $NV^-$ symmetry axis will induce Berry phase shifts in the $NV^-$ electronic ground-state coherences proportional to the solid angle subtended by the symmetry axis. It is estimated that a sensitivity in the range of $5 \times 10^{-3}$ rad $s^{-1}$ $Hz^{-1/2}$ in a 1-$mm^3$ sensor volume can be achieved using a simple Ramsey sequence. Incorporating dynamical decoupling to suppress dipolar relaxation may yield a sensitivity at the level of $10^{-5}$ rad $s^{-1}$ $Hz^{-1/2}$.

The other scheme is a modified Ramsey scheme, where Berry phase shifts in the $^{14}$N hyperfine sublevels can be employed. The projected sensitivity is in the range of $10^{-5}$ rad s$^{-1}$ Hz$^{-1/2}$, however, the lower gyromagnetic ratio of $^{14}$N nuclei reduces the sensitivity to magnetic-field noise by several orders of magnitude. Reaching $10^{-5}$ rad s$^{-1}$ Hz$^{-1/2}$ would represent an order of magnitude improvement over other compact, solid-state gyroscope technologies.

Geometric phase shifts, also known as Berry phase shifts, arise when the symmetry axis of a system is rotated about an axis that is not parallel to this axis. This results in relative phase shifts of the magnetic sublevels. One encounters Berry phase shifts, for example, when a spin system evolves in time in the presence of an external magnetic field, which itself rotates in space in such a way that the field vector traces a nonzero solid angle. In the case of adiabatic evolution, an eigenstate with magnetic quantum number m acquires a Berry phase (in addition to the phase due to evolution under the static Hamiltonian) that is given by the product of m and the solid angle traced by the field, dΩ. If the quantization axis is determined by an electric field, a similar effect occurs upon rotating the electric field.

The nitrogen-vacancy center features a ground state with electronic spin S=1 which can be initialized, manipulated, and detected through convenient optical and microwave transitions. Furthermore, the lifetime of the ground-state coherences can be quite long, on the order of 2 ms in $^{13}$C-depleted samples, even without applying dynamic decoupling sequences. The analysis presented below indicates that sensitivities at the level of $\approx 10^{-5}$ rad s$^{-1}$ Hz$^{-1/2}$ should be achievable in millimeter scale packages.

Furthermore, operation as a three-axis sensor may be possible by monitoring coherences in NV$^-$ centers with different orientations with respect to the host lattice. NV$^-$ centers possess $C_{3v}$ symmetry and can be oriented along any of the four crystallographic orientations. The electronic ground state is spin-triplet (S=1).

Generally, the structure of the nitrogen-vacancy based gyroscope has a diamond slab sensor that is mounted to a spindle that can be rotated. The diamond slab has preferably been processed to have a lattice structure that has many NV centers that have a substitutional nitrogen next to a vacancy. One method for the preparation of NV centers is to irradiate a diamond with electrons, protons or neutrons to create vacancies and then anneal by exposure to temperatures greater than approximately 700° C.

Surrounding the diamond slab are microwave wave guides and radio frequency coils. A light source in the form of a green laser (532 nm) or infrared laser is positioned to polarize and read out the NV centers in the diamond. Photodetectors are also positioned to detect fluorescence intensity from the diamond and/or the transmitted light.

Further aspects of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes several embodiments of the gyroscope structures and methods for inertial sensing of the present invention are depicted generally in FIG. 1 through FIG. 8 as well as the associated methods for using the apparatus. It will be appreciated that the methods may vary as to the specific steps and sequence and the gyroscope architecture may vary as to structural details, without departing from the basic concepts as disclosed herein. The method steps are merely exemplary of the order that these steps may occur. The steps may occur in any order that is desired, such that it still performs the goals of the claimed invention.

Figure 1:
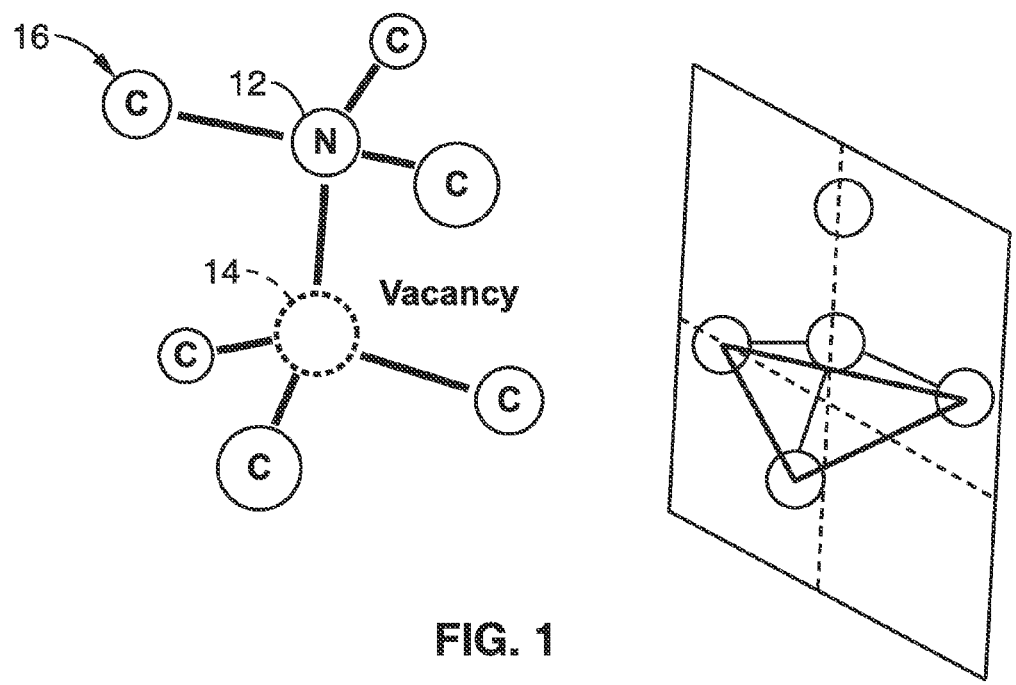
FIG. 1 is a schematic diagram of a lattice structure of a nitrogen vacancy center and $C_{3v}$ symmetry group according to the invention.

By way of example, and not of limitation, the gyroscopic sensors of the present invention exploit the geometric-phase effects in diamond from high-density ensembles of nitrogen-vacancy (NV$^-$) centers. FIG. 1 illustrates a nitrogen-vacancy structure within in a diamond lattice. The nitrogen-vacancy centers exist in two charge states, NV$^0$ and NV$^-$, where the negatively charged center is of primary interest since it is possible to optically polarize and readout the NV$^-$ spin state.

An individual negatively charged nitrogen-vacancy center in diamond is comprised of a substitutional nitrogen atom 12 and a vacancy 14 at an adjacent site within the carbon lattice 16 as shown schematically in FIG. 1. The center has a trigonal $C_{3v}$ symmetry with the nitrogen atom and the vacancy lying on the $C_3$ axis. There are three carbon and two nitrogen sp$^3$-hybrid electrons that are pointing toward the vacancy in the neutral nitrogen-vacancy (NV$^0$) center.

Figure 2:
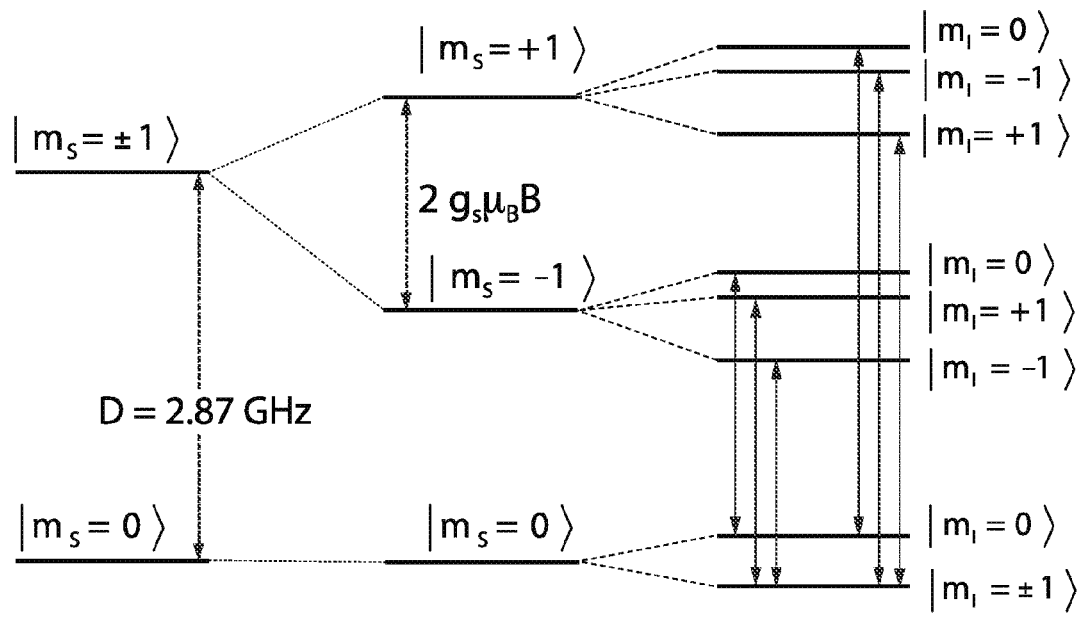
FIG. 2 is a graph plotting ground state energy levels of the NV$^-$ centers in the presence of a magnetic field of several gauss and accounting for $^{14}$N hyperfine coupling.

Referring also to FIG. 2, the electrons at the NV center occupy an orbital with $^3A_2$ symmetry in the ground state that can be excited with an optical transition to an excited $^3$E state. The ground state is characteristically split by spin-spin interactions and the excited state is split by spin-orbit interactions. As illustrated in FIG. 2, the $^3A_2$ ground state is split by spin-spin interactions by spin sublevels of D=2.87 GHz into a state with a spin projection of a $m_s$=0 and a $m_s$=±1 doublet under zero magnetic field conditions. The $^3A_2 \leftrightarrow {}^3$E transition has a zero-phonon line (ZPL) at 638 nm, and a phonon side-band (PSB) that spans from 638 nm to about 450 nm in absorption. Applying a static magnetic field along the NV axis leads to a splitting of the $m_s=+1$ and $m_s=-1$ states.

Once excited, an NV⁻ center can decay back to the ground states directly (through the spin-conserving transition $^3A_2 \leftrightarrow {}^3E$) emitting red fluorescence in the phonon sideband (with wavelength 637-800 nm) or through a spin non-conserving channel through the spin-singlet states $^1A_1$ and $^1E$. Generally, optical excitation of the NV center results in optical pumping into the $m_s=0$ sublevel, due to an intersystem crossing through the singlet levels that preferentially transfers the $m_s=\pm1$ states from the $^3E$ excited-state to the $m_s=0$ sublevel in the ground $^3A_2$ state. Moreover, the intersystem crossing results in a higher fluorescence of the $m_s=0$ state than the $m_s=\pm1$ states upon $^3A_2 \leftrightarrow {}^3E$ excitation, enabling optical spin read-out and detection of the ground-state spin transitions by optically detected magnetic resonance (ODMR). Through hyperfine interaction, ODMR can also detect nuclear spins in diamond such as $^{13}C$, $^{14}N$, $^{15}N$.

Ground-state energy levels of NV⁻ centers in the presence of a magnetic field of several gauss, and accounting for $^{14}N$ hyperfine coupling, is shown in FIG. 2. Vertical double-headed arrows show the allowed microwave transitions, which preserve the nitrogen spin, $m_I=0$.

In the absence of strain or an external magnetic field, the $m_S=\pm1$ levels are degenerate, where $m_S$ is the quantum number associated with the projection of S along the symmetry axis. Due to the spin-spin interaction, the zero-field splitting between the $m_S=0$ and the $m_S=\pm1$ levels is D=2.87 GHz as described previously.

The application of a magnetic field $B_Z$ along the NV⁻ symmetry axis produces a shift of the ground-state energy levels according to $m_S g_s \mu_B B_z$, where $g_s \approx 2$ is the Landé factor for the electron and $\mu_B=8.79$ rad/s/G is the Bohr magneton. The orientation is assumed to be parallel to the magnetic field. The projection of such a magnetic field onto the other three axes is suppressed by a factor of 3.

Therefore, for sufficiently large magnetic fields (≈10 G or greater), the microwave transitions of differently oriented NV⁻ centers are well isolated from NV⁻ centers whose symmetry axis is parallel to the field. Since microwave transitions are excited resonantly, the contributions from these other orientations can be ignored. In the presence of local strain, the $m_s=\pm1$ sublevels are mixed and the corresponding eigenstates are split in energy by 2 E, where E is the transverse zero-field splitting parameter, typically of the order of a few megahertz for high-NV⁻ center density samples. Application of magnetic fields of several gauss will overwhelm this, so that eigenstates are approximately those of $S_z$. Finally, hyperfine coupling of the $^{14}N$ nuclear spin (I=1) to the electronic degrees of freedom produces additional splittings as shown at the right in FIG. 2.

Spin states are preferably detected by Optically Detected Magnetic Resonance (ODMR) spectroscopy. Optical transitions from the $^3A_2$ ground states to the $^3E$ excited-state manifold are spin conserving, preserving the magnetic quantum number $m_S$, and are typically excited via the phonon sideband (PSB) of the $^3A_2 \rightarrow {}^3E$ transition using 532-nm light. Optical pumping of the $m_S=0$ ground state occurs through spin-non-conserving decay pathways (due to spin-orbit coupling) involving singlet levels not shown in FIG. 2.

Fluorescence in the zero-phonon line at 637 nm and the associated PSB is brighter for NV⁻ starting in the $m_S=0$ state. Thus, application of microwaves tuned to the $m_S=0 \rightarrow m_S=\pm1$ ground-state transitions depopulates the $m_S=0$ state and reduces fluorescence in the zero-phonon line and its PSB. Assuming that the NV⁻ center is aligned with the magnetic field, and neglecting $^{14}N$ hyperfine coupling, fluorescence as a function of microwave frequency appears as a doublet, centered about D, with a splitting determined by the magnetic field $\Delta=2g_s\mu_B B_z$ (assuming $gs\mu_B B_z$ is much greater than E). If $^{14}N$ hyperfine coupling is resolved, each line of the doublet splits into a triplet.

In another embodiment, detection of the spin state is accomplished by monitoring transmission of infrared light tuned to the 1042-nm transition between the two singlet levels, resulting in improved light collection.

Figure 3:
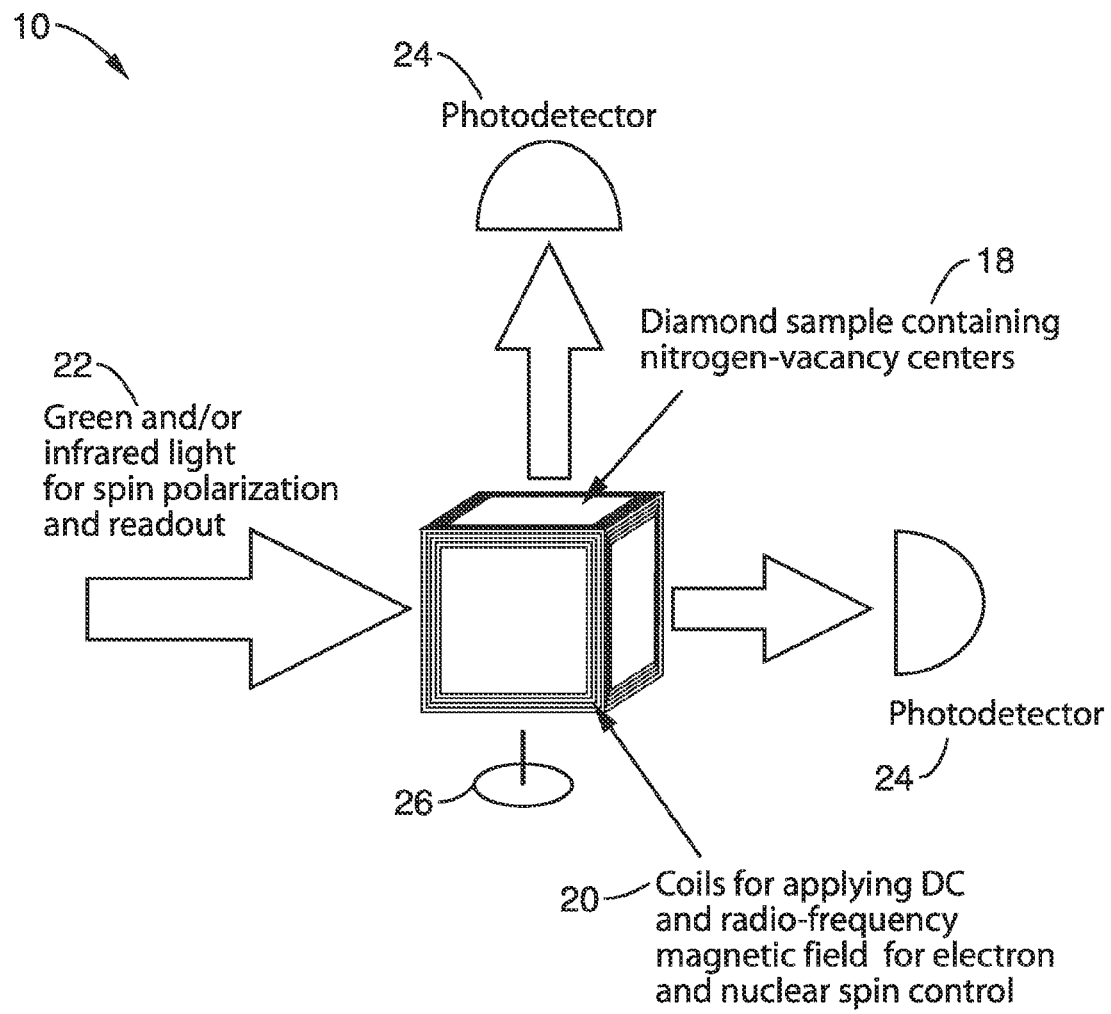
FIG. 3 is a conceptual schematic diagram of a gyroscope device with diamond slab, radio-frequency coils, microwave wave guide, light source and photodetectors according to one embodiment of the invention.

Turning now to FIG. 3, a functional schematic of a gyroscope apparatus 10 is shown. At the core of the apparatus is a diamond sample 18 containing an ensemble of nitrogen-vacancy centers. The nitrogen-vacancy centers can be created in the diamond lattice of natural or synthetic diamonds that are used as the core sensor material. Diamonds are conventionally classified according to the level and type of chemical impurity they contain. The most common class of diamond (Type Ia) contains nitrogen as the main impurity at levels up to 3000 parts per million and the class includes most natural diamonds that are available. Synthetic diamonds (Type Ib) may have up to 500 ppm of nitrogen diffused through the lattice.

The preferred diamond is a high pressure-high temperature synthetic diamond that is either acquired or made that would fall under the Type Ib classification. Initial nitrogen concentrations of between approximately 50 ppm to approximately 150 ppm are particularly preferred.

To create nitrogen-vacancies in the selected diamond, the diamond may be irradiated with relativistic electrons, protons, neutrons or other particles to create vacancies in the diamond lattice. The preferred radiation for this purpose is >3 MeV electrons. The radiation typically can create concentrations of vacancies that are the same as the nitrogen concentration in the diamond.

The irradiated diamonds are then annealed with temperatures greater than 700° C. to immobilize the vacancies and stabilize the NV centers. For example, a type-Ib diamond with 50 ppm of initial nitrogen concentration could be irradiated with 3 MeV electrons and annealed at 750° C. for 2 hours. The NV-center concentration after this process is estimated to be on the order of 10 ppm.

Optionally, the resulting diamonds can then be characterized to determine an approximate nitrogen-vacancy concentration. Diamonds with NV center vacancy concentrations of between approximately 10 ppm and approximately 200 ppm are preferred.

The diamond 18 may be in the form of a slab or cube and have DC coils or radio-frequency coils 20 adhered to the surface for applying DC and radio-frequency magnetic fields for electron and nuclear spin control. A microwave waveguide may also be fabricated on or adjacent to the diamond 18 surfaces.

Adjacent to the diamond structure 18 is a light source or sources 22 for spin polarization and readout. A light source such as a laser or light emitting diode (LED) with wavelength of 532 nm ±20 nm can be used to polarize the NV centers. Photodetectors 24 are used to measure the resulting fluorescence intensity over time. The diamond 18 centers are optically pumped, polarized and then the NV⁻ spin states are read and evaluated.

Figure 4A:
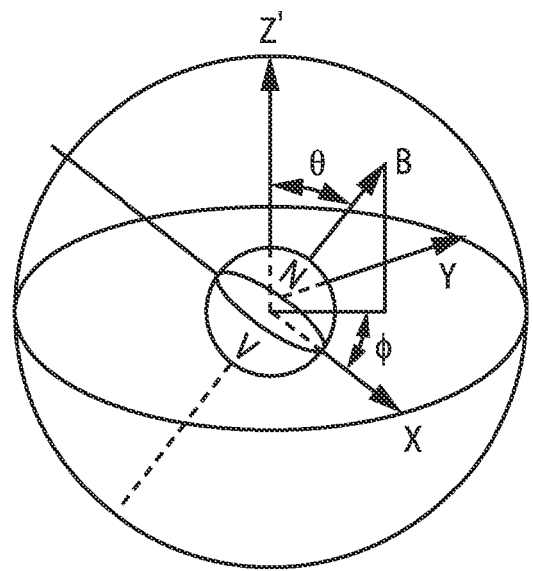
FIG. 4A is a schematic diagram of the general geometry of a nitrogen-vacancy defined with respect to a lab-frame coordinate system.
Figure 4B:
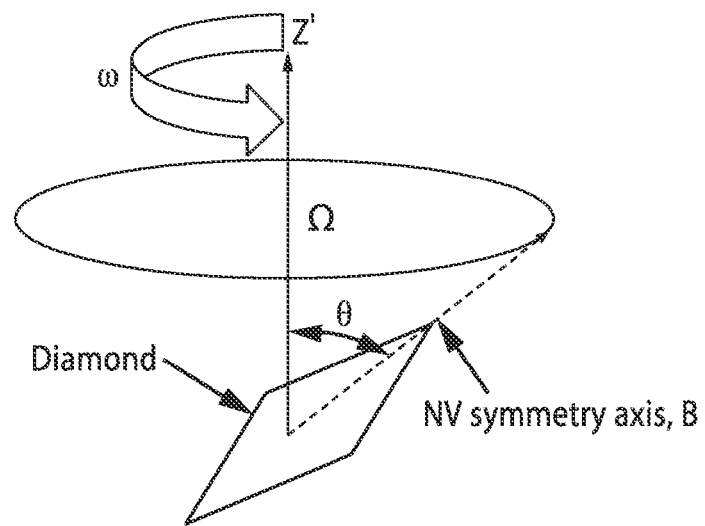
FIG. 4B is a schematic diagram of the rotation of the diamond about an axis oriented at an angle with respect to the NV$^-$ symmetry axis.

The diamond 18 is mounted to a motorized spindle 26 that allows it to be rotated about an axis. FIG. 4A and FIG. 4B show the geometry of an NV center in the diamond 18 lattice defined with respect to the lab frame (x,y,z). The dashed line B represents the NV axis with the magnetic field direction of the microwave pulses in the z direction. The parameters θ and φ vary adiabatically. FIG. 4B shows the rotation of the diamond around an axis z' oriented at an angle θ with respect to the NV⁻ symmetry axis B. The ensemble of NV⁻ centers is pumped into the $m_S=0$ state, with a magnetic field (≈10 G) applied along the NV⁻ axis and the ¹⁴N hyperfine coupling is not considered.

Sensing with the platform generally seen in FIG. 3 can be accomplished using one of two preferred schemes: 1) Berry phase based sensing and 2) Nuclear-spin based sensing.

In the first scheme, rotation of the NV⁻ symmetry axis will induce geometric (i.e. Berry phase) shifts in the NV⁻ electronic ground-state coherences proportional to the solid angle subtended by the symmetry axis.

The ensemble of NV⁻ centers is pumped into the $m_S=0$ state, with a magnetic field (≈10 G) applied along the NV⁻ axis and the ¹⁴N hyperfine coupling is not considered.

As seen in the configuration of FIG. 4B, the diamond is rotated with an angular velocity w about an axis z' oriented at an angle θ relative to the NV⁻ symmetry axis (θ≤π/2) during some interval t. The symmetry axis thus traces a solid angle described by the equation:

$$\Omega = \int_{f=0}^{\omega t} \int_{\theta'=0}^{\theta} df \theta' \sin\theta = \omega t(1-\cos\theta).$$

In the course of this rotation, the Zeeman eigenstates of the NV⁻ center pick up a geometric phase shift $\Delta\phi = m_S\Omega$. It can be seen from this equation that the geometric phase shift is maximized for θ=π/2. When coherences between $m_S=0$ and $m_S=\pm1$ states prior to rotation are established, the observed transition frequencies will be $\omega\pm = 2\pi D \pm g_s\mu_B B \pm \omega(1-\cos\theta)$.

The observed frequency shifts associated with rotations involve both the rotation rate ω and the angle of rotation with respect to the NV⁻ symmetry axis, θ, as seen in FIG. 4B. If the magnetic field is oriented such that resonances due to all four NV⁻ orientations are resolved, Berry phase shifts in the four different orientations can be used to determine both the direction of rotation and its magnitude.

One preferred readout scheme is a Ramsey scheme, where NV⁻ centers are initialized in the $m_S=0$ sublevel by the application of 532-nm pump light. A π/2 microwave pulse is then applied to the spins and they are allowed to precess freely for a time t, and then a second π/2 pulse is applied, thereby converting coherences back into populations.

Finally, the spin state is read out by monitoring fluorescence while illuminating the sample with 532-nm pump light. The resulting fluorescence is given by the equation:

$$F \approx \eta N(1 + R\cos\omega\pm t).$$

In this equation, R is the detection contrast for states with $m_S=0$ and $m_S=\pm1$, η is the collection efficiency, and N is the number of participating NV⁻ centers. This assumes a roughly optimal readout, in which each center emits one photon in the readout stage. The slope of the fluorescence with respect to rotation rate ω (assuming ω is small) is maximized by tuning B and t such that $(2\pi D + g_s\mu_B B)t = (n\pm\frac{1}{4})2\pi$, where n is an integer, thereby optimizing the sensitivity to rotations. Under such conditions dF/dω is approximately equal to $\pm\eta NRt$.

The accuracy with which one can determine the rotation frequency w is $\delta\omega = (dF/d\omega)^{-1}\delta F$. Fundamentally limiting the noise in the fluorescence is photon shot noise, $\delta F = \sqrt{\eta N}$. Setting $t=T_2^*$, and repeating the measurement $\tau/T_2^*$ times (τ is the total integration time), we find $$\delta\omega = \frac{1}{\left(R\sqrt{\eta N T_2^* \tau}\right)}.$$

To evaluate the rotation sensitivity with this equation, parameters were conservatively estimated, where NV⁻ ensembles had a density of $n=10^{18}$ cm⁻³, $T_2^* \approx 300$ ns, and a measurement volume of 1 mm³. Assuming q =0.5, one-fourth of the NV⁻ centers participating, a measurement volume of 1 mm³, and a measurement time of T=0.5 s (corresponding to a bandwidth of 1 Hz), this equation yields a rotation sensitivity of about $5.4\times10^{-3}$ rad5⁻¹ Hz⁻¹/².

Fluorescence detection may suffer from a poor contrast ratio and poor detection efficiency (typically R≈0.03 and η0.01). The detection efficiency can be substantially improved to η1 by employing IR absorption.

In addition, CPMG decoupling sequences can be used to extend coherence times by an order of magnitude when ¹⁴N impurities limit the lifetime. For example, coherence lifetimes as long as 300 ms in low-NV density samples in isotopically pure ¹²C diamond using a CPMG decoupling sequence at 77 K have been observed.

It has also been observed that dipole-dipole coupling between NV⁻ centers appear to limit the lifetime. Such relaxation may be mitigated by pulse sequences such as MREV or WAHUHA, which average the dipole-dipole interaction to 0 and scale the rank 1 gyroscopic phase shift (for WAHUHA, the scaling factor is 1/√3).

Ultimately, $T_1$ places an upper bound on $T_2$. Room-temperature measurements of $T_1$=3 ms were measured for the high NV⁻ density samples of present interest. Assuming that dipole-dipole relaxation can be sufficiently suppressed in high-density ensembles, one can expect an improvement in sensitivity of roughly two orders of magnitude over the estimate given above, placing the sensitivity in the range of $10^{-5}$ rad s⁻¹ Hz⁻¹/².

Magnetic-field fluctuations may also present a source of noise in this scheme. The sensitivity to magnetic-field fluctuations is given by $\delta\omega = (\partial F/\partial\omega)^{-1}(\partial F/\partial B)\delta B = g_s\mu_B \delta B$. In order to reach an angular-frequency sensitivity of $5.4\times10^{-3}$ rad s⁻¹, a magnetic-field stability $\delta B \approx 3\times10^{-10}$ G may be required. Assuming that approximately 10 G is required to sufficiently suppress the stress parameter, this corresponds to a fractional field stability at the level of about $10^{-10}$.

The temperature dependence of the D coefficient places requirements on the thermal stability. The temperature dependence of D near room temperature is linear, with a slope of about −70 kHz/K. To reach $10^{-3}$ rad 5⁻¹ Hz⁻¹/² requires a thermal stability at the level of $10^{-9}$ K. Such a stability seems unrealistic, however, if one monitors the splitting of the ODMR signal for $m_S=\pm1$ rather than the position of just a single line, the temperature dependence should be eliminated. This also improves the sensitivity of the gyroscope by a factor of √2.

Nuclear spins are appealing in the context of gyroscopes because their gyromagnetic ratio is about three orders of magnitude lower than that of the electron, relaxing the requirements on the field stability. Recent work has shown that it is possible to achieve very high (≈98%), polarization of single ¹⁴N or ¹⁵N nuclear spins in the NV⁻ center (as well as nearby ¹³C spins) using an excited-state level anti-crossing at about 500 G, induced by the hyperfine coupling of the nucleus with the electrons of the center. This technique has been extended to polarization of ¹⁴N and proximal ¹³C nuclear spins in ensembles of NV⁻ centers. The ¹⁴N spin state can be detected via fluorescence or IR absorption by the NV⁻ center.

Figure 5:
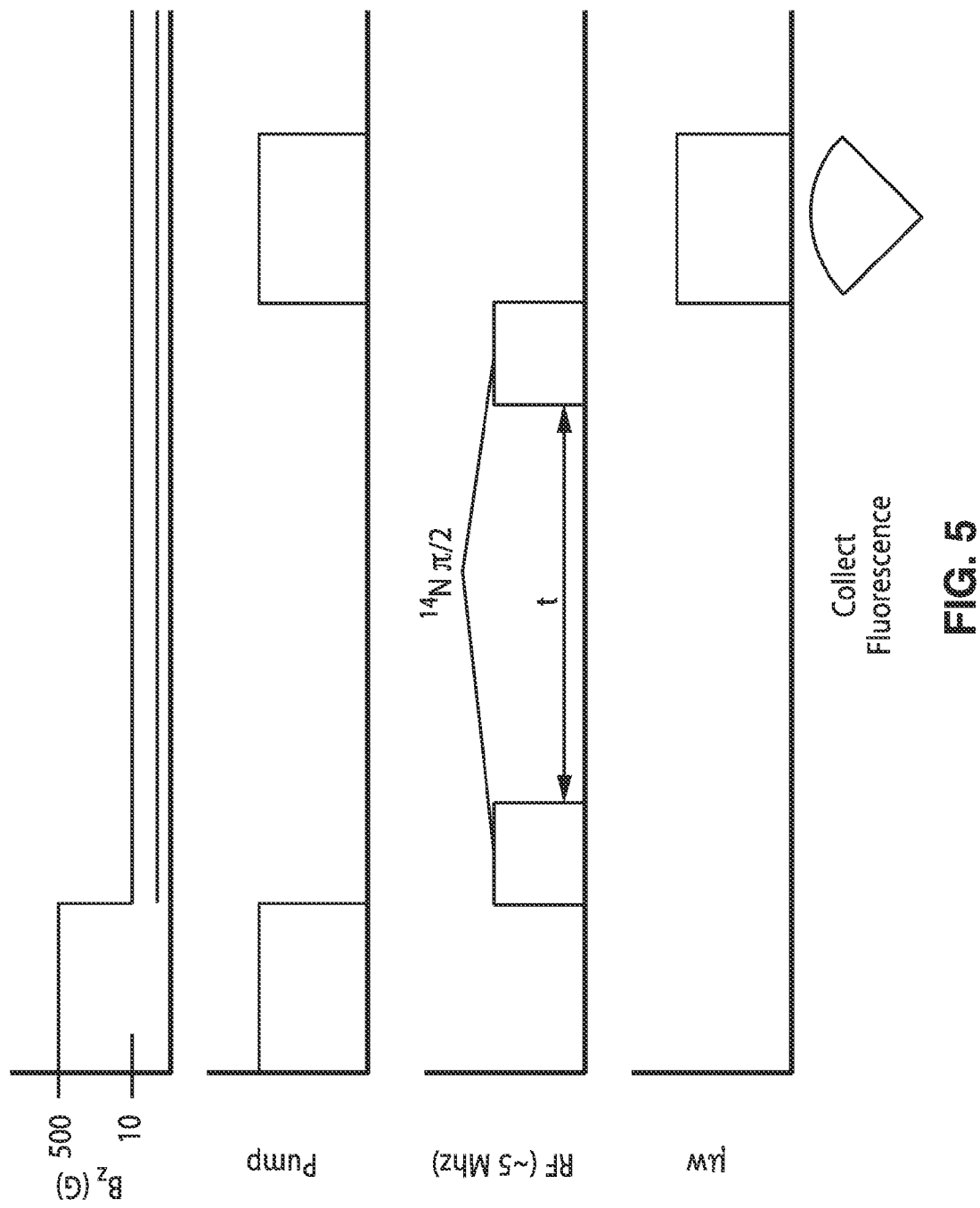
FIG. 5 is an illustrative pulse sequence for a Berry-phase-based gyroscope using resolved $^{14}$N hyperfine structure in the diamond.

An example of a protocol for a ¹⁴N diamond-based gyroscope is generally presented in FIG. 5 that shows a pulse sequence for a Berry-phase-based gyroscope using resolved ¹⁴N hyperfine structure in diamond. In this scheme, NV- centers are polarized in the $|m_S=0, m_I=-1\rangle$ state by turning the magnetic field (oriented parallel to the NV- symmetry axis) up to about 500 G while illuminating the sample with 532-nm light. The light is turned off and the magnetic field reduced to about 10 G (to improve stability), and coherences between the $|m_S=0, m_I=-1\rangle$ and the $|m_S=0, m_I=0\rangle$ ground-state sublevels are established by the application of a π/2 pulse that is resonantly tuned to the hyperfine transition frequency $\omega_{hf}\approx5.1$ MHz. Spins are allowed to evolve freely for some time t in the presence of the magnetic field, hyperfine coupling, and sample rotation, accruing nuclear Zeeman, hyperfine, and geometric phase shifts. A second π/2 pulse converts these coherences back into $^{14}$N Zeeman-sublevel populations, which are then selectively read out by applying microwaves tuned to the desired $^{14}$N hyperfine transition. The population in the selected level would oscillate sinusoidally with a frequency proportional to $\omega_{nuc}=\omega_{hf}+\gamma NB+\omega$, where γN is the gyromagnetic ratio of the nitrogen nucleus.

The value of θ is preferably set at θ=π/2 so that the factor 1−cos θ in the equation is equal to 1. Since the microwave and optical transitions preserve $m_I$, this results in a sinusoidal modulation of the resulting fluorescence of F, $$F \mu 1 + R \frac{\Delta B^2}{(B-B_0)^2 + \Delta B^2} \cos\omega_{nuc}t.$$

Here, $B_0$ is the magnetic field corresponding to resonance with the applied microwaves and $\Delta B=1/(T_2 g_s \mu_B)$ is the width of the microwave transition in magnetic-field units. The Lorentzian profile for the microwaves is included to address the possibility of noise due to magnetic-field fluctuations. As shown below, it turns out that this factor drops out. The same arguments used to derive the sensitivity of gyroscopes based on pure electronic transitions apply in this case as well.

The exact value of $T_2^*$ will depend on the conditions and sample preparation. It has been observed that in some instances, the nuclear spin coherence times $T_{2,nuc}^*$ can be significantly longer for nuclear spins than for electron spins. For example, with single NV⁻ centers, it has been observed that $T_{2,e}^* \approx 1.4$ μs, while $T_{2,nuc}^* \approx 58$ μs for $^{14}$N spins.

In $^{13}$C-depleted diamonds with a low NV⁻ density, $^{14}$N coherence lifetimes $T_2=7$ ms have been realized. Taking $T_{2,nuc}^*=1$ ms, a calculated sensitivity at the level of $9\times10^{-5}$ rad s⁻¹ Hz⁻¹ᐟ² is seen with other parameters as used above, and without requiring dynamical decoupling.

Despite the fact that microwave transitions may be used to selectively read out the nuclear spin state, the sensitivity to magnetic-field fluctuations is dramatically reduced compared to the case of gyroscopes based solely on electronic transitions: $\delta\omega=(\partial F/\partial\omega)-1(\partial F/\partial B)\delta B=\gamma N\delta B$. This is suppressed relative to the case of electronic coherences by a factor of $\gamma N/(g_s\mu_B)\approx9000$ for $^{14}$N, greatly relaxing the requirements on the field stability.

Likewise, NV⁻ centers have been used to polarize bulk $^{13}$C in elevated magnetic fields, and efforts are under way to produce polarization of bulk $^{13}$C nuclear spins in low magnetic fields. Bulk $^{13}$C spins can potentially have very long $T_1$ times, and if decoupling schemes can yield correspondingly long $T_2$ times, dramatic improvements in sensitivity may be expected.

Accordingly, a solid-state gyroscope is provided based on geometric phase effects and nuclear spins in diamond NV⁻ centers. A nuclear-spin embodiment of the method is shown in FIG. 6 and the Berry-phase embodiment of the method is generally described in the scheme shown in FIG. 7.

Figure 6:
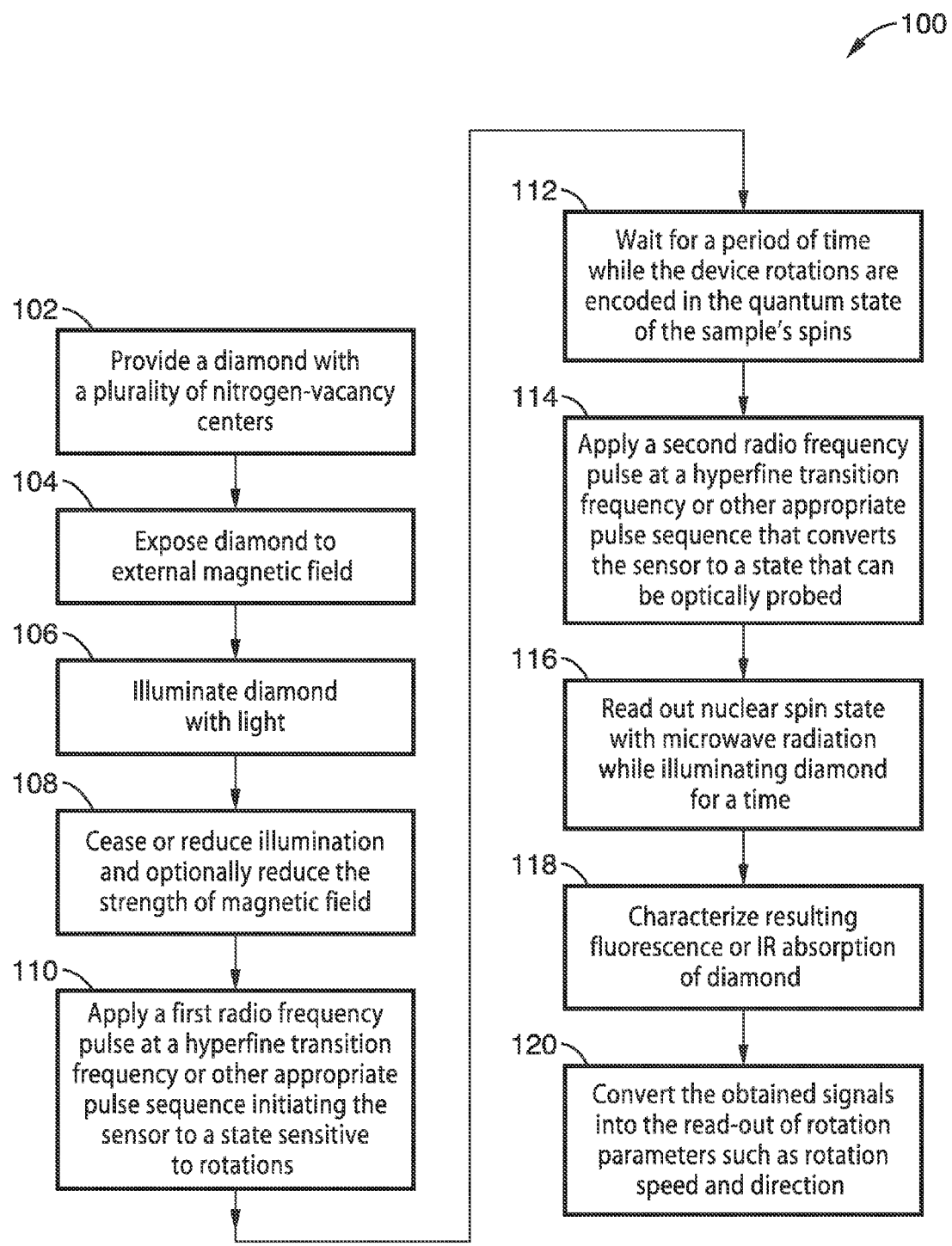
FIG. 6 is a flow diagram of a method for inertial sensing according to one embodiment of the invention.

Referring now to FIG. 6, a method 100 for inertial sensing using a gyroscope based on nuclear spin with nitrogen-vacancy centers in diamonds is illustrated. At block 102, a diamond sensor with an ensemble of nitrogen-vacancy centers is provided. The preferred number of vacancy centers in the diamond lattice is between approximately 10 ppm and 200 ppm. The nitrogen-vacancy centers are preferably created by irradiating diamonds with >3 MeV electrons to create lattice vacancies. The irradiated diamonds are then annealed at temperatures greater than approximately 700° C. and optionally characterized. The diamond is set on a spindle within the body of the gyroscope.

At block 104, the NV⁻ centers of the diamond are polarized by exposure to an external magnetic field and illumination by an excitation light at block 106. The magnetic field presented at block 104 is preferable between approximately 400 G and approximately 600 G with approximately 500 G particularly preferred. The preferred excitation light is 532 nm ±20 nm light.

To improve stability, at block 108, the intensity of the light is reduced or eliminated and the strength of the magnetic field is optionally reduced to approximately 10 G.

Coherences between ground state sublevels are established with the application of a first radio frequency pulse at a hyperfine transition frequency or other appropriate pulse sequence initiating the sensor to a state sensitive to rotations at block 110. A π/2 pulse at a hyperfine transition frequency (approximately 5.1 MHz) is particularly preferred.

The device rotations are encoded in the state of the spins of the sample over a period of time at block 112. The length of the period of time that is necessary to encode may vary.

At block 114, a second radio frequency pulse at a hyperfine transition frequency or other appropriate pulse sequence is applied that converts the sensor to a state that can be optically probed.

The nuclear spin state is read by microwaves tuned to a desired hyperfine transition and optical pulses at block 116. The resulting fluorescence or infrared absorption of the diamond is characterized at block 118 and the obtained signals are converted into the read-out of rotation parameters such as rotation speed and direction at block 120.

Figure 7:
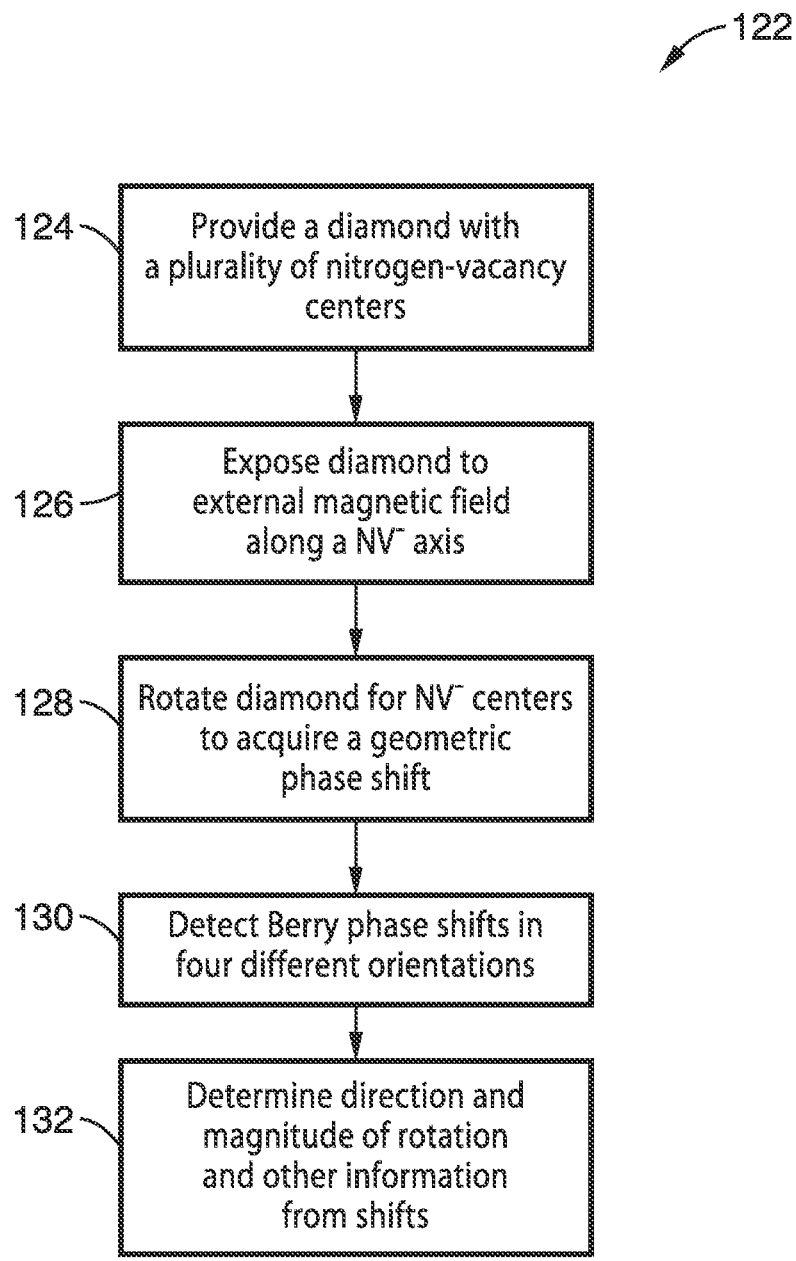
FIG. 7 is a flow diagram of a method for inertial sensing according to one embodiment of the invention.

Referring now to FIG. 7, a method 122 for inertial sensing using a gyroscope based on Berry phase shifts with nitrogen-vacancy centers in diamonds is schematically illustrated. At block 124, a diamond with an ensemble of nitrogen-vacancy centers is provided.

The diamond is exposed to an external magnetic field applied along the NV⁻ axis at block 126. The strength of the applied magnetic field is preferably between 0 G and 50 G with approximately 10 G particularly preferred. The ensemble of NV⁻ centers are pumped into the $M_S=0$ state at block 126.

At block 128, the diamond sensor is rotated within the magnetic field and the NV⁻ centers acquire a geometric phase.

The geometric phase shifts at different orientations are detected at block 130 and the direction and magnitude of rotation and other information is derived at block 132.

The invention may be better understood with reference to the accompanying examples, which are intended for purposes of illustration only and should not be construed as in any sense limiting the scope of the present invention as defined in the claims appended hereto.

Example 1

Figure 8:
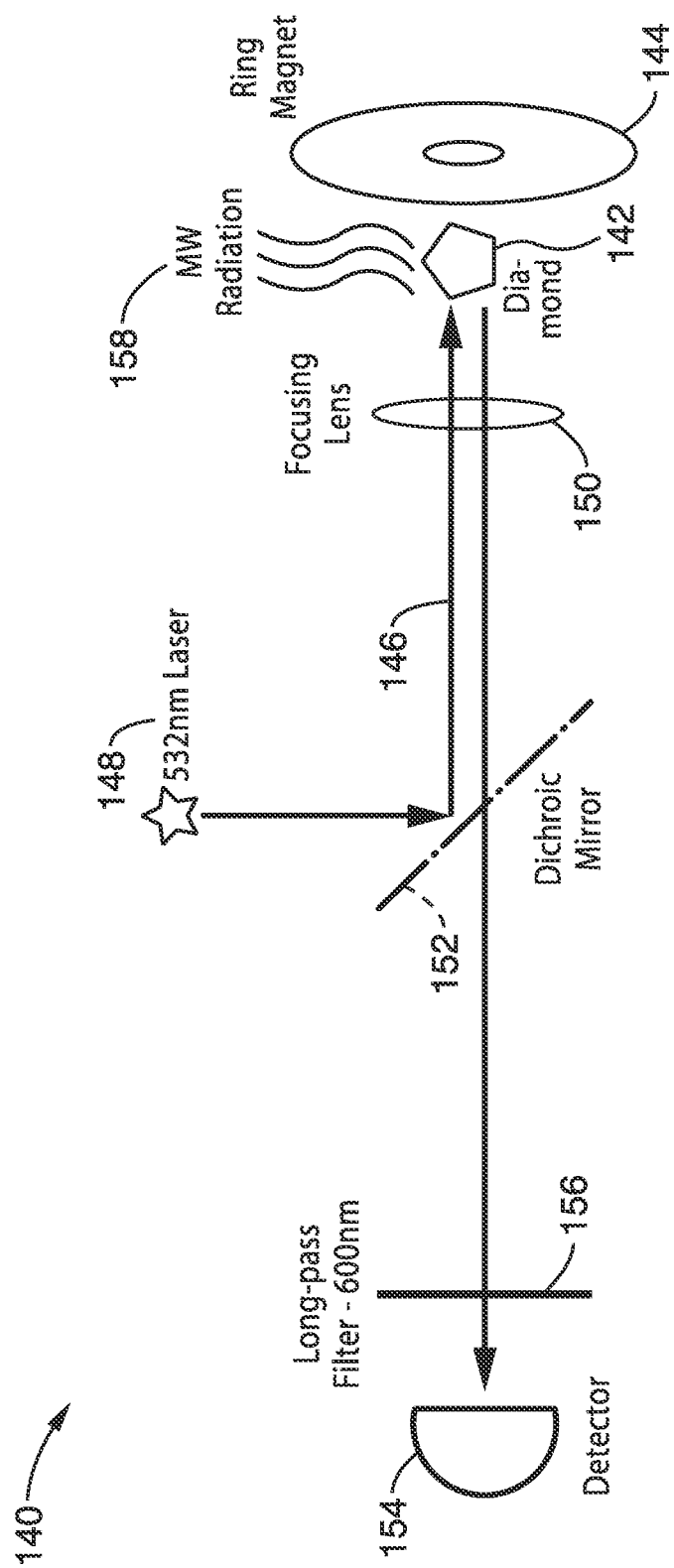
FIG. 8 is a schematic diagram depicting one detailed set up of the apparatus according to the invention.

In order to demonstrate the functionality of the methods, an apparatus 140 shown schematically in FIG. 8 was assembled. The apparatus 140 used a high pressure high temperature (HPHT) diamond slab 142. The diamond 142 had a nitrogen concentration of approximately 200 ppm and a concentration of NV⁻ centers of 12 ppm. The diamond was cut perpendicular to the [100] crystallographic direction.

The diamond 142 is located in a static magnetic field produced by a permanent magnet 144. A microwave (MW) generator 158 sent current through a wire located on top of the diamond 142 that produced the MW field. Green (532 nm) light 146 from a laser 148 was focused onto the diamond 142 using a confocal setup with an aspheric lens 150 with a focal length of 4 mm and a numerical aperture NA=0.60.

The resulting red fluorescence from the diamond 142 was detected with a photodiode 154 after passing through a dichroic mirror 152 and a filter 156. The amount of red fluorescence as a function of green light power was obtained and plotted.

The saturation power for equalizing the populations of the ground ($^3A_2$) and excited ($^3E$) states is denoted $P_{sat}$. The MW frequency was scanned and the optically detected magnetic resonance (ODMR) signal was recorded using an oscilloscope. Four different orientations of the NV axis in the diamond lattice are possible leading to eight magnetic resonances (since each of the four orientations has two electron-spin resonances: $|m_S=0\rangle \leftrightarrow |m_S=+1\rangle$ and $|m_S=0\rangle \leftrightarrow |m_S=-1\rangle$. A static magnetic field of 77 G was aligned along one of the [111] crystallographic directions. In this case, the NV centers that oriented along this axis have magnetic-resonance frequencies which are different from the overlapping resonances of the three other orientations. For this magnetic-field direction, one should therefore observe four magnetic-resonance frequencies.

Optically detected magnetic resonance signals were recorded for different settings of the MW and light powers. To determine the strength of the MW field, a pulsed calibration measurement was employed where the on-resonance Rabi frequency was measured for different MW settings. The expected $f_R \propto \sqrt{P_{MW}}$ square-root dependence of the Rabi frequency on the MW power was observed. The ODMR signals were normalized to the signal obtained when the MW frequency is far detuned. Four magnetic-resonance frequencies of the NV center were observed, as expected when the magnetic field is along one of the [111] directions.

Example 2

To further demonstrate the methods, the transfer of the polarization of the electron spins of negatively charged nitrogen vacancy (NV) centers to the nuclear spins at the excited-state level anti-crossing (ESLAC) of the center was demonstrated. Polarization of 80% for the $^{14}$N nuclear spins within the NV centers, as well as a 50% polarization of proximal $^{13}$C nuclear spins was observed.

A type-Ib diamond with initial nitrogen concentration of 50 ppm was obtained and irradiated with 3 MeV electrons and annealed at 750° C. for 2 hours to provide a sensor platform. The NV-center concentration in the diamond after this process is estimated to be on the order of 10 ppm. The inhomogeneously broadened full width half maximum of the ground-state resonance is about 2.5 MHz, so the hyperfine splitting in the ground state (2.14 MHz) due to interaction with $^{14}$N was discernible.

Using a similar apparatus as that shown in FIG. 8, a spherical lens with focal length of 15 mm was provided that focused a 532 nm, 100 mW laser beam on the diamond. Fluorescence was collected with the same lens and filtered from the excitation light with a dichroic mirror and a 600 nm long-pass filter, and detected with a photodiode. A microwave (MW) field was applied with a 100 μm diameter copper wire placed near the optical focus on the diamond surface. A magnetic field was applied with a permanent ring magnet and was aligned to less than 1° from the [111] axis. The alignment of the magnetic field with respect to one of the NV centers' orientations is important for achieving a high degree of nuclear spin polarization. The axial magnetic field was scanned in the range of 520 ±30 Gauss by controlling the current in a 150 mm diameter copper coil that surrounded the diamond. It was noted that the polarization process requires only optical excitation that pumps the electronic spin of the NV center, and a proper alignment and magnitude of the magnetic field.

In an ensemble of NV centers aligned along the magnetic field, the non-axial hyperfine interaction at the ESLAC results in polarization of both nuclear spin species. This means that the proximal $^{13}$C nuclear spins will be polarized, as well as the $^{14}$N which are part of the NV center. These NV centers exhibit a double hyperfine splitting—one due to the $^{14}$N nucleus, and one due to the $^{13}$C nucleus.

From the discussion above it will be appreciated that the invention can be embodied in various ways, including the following:

1. A method of inertial sensing, comprising: (a) providing a diamond sensor with a plurality of nitrogen-vacancy centers; (b) exposing the diamond sensor to a magnetic field along nitrogen-vacancy center axes; (c) rotating the diamond sensor to generate geometric phase shifts in the nitrogen-vacancy centers; (d) detecting geometric phase shifts; and (e) reading information from geometric phase shifts.

2. The method of any previous embodiment, wherein the diamond sensor has nitrogen-vacancy centers with a concentration of between 10 and 200 vacancies per million carbon atoms.

3. The method of any previous embodiment, wherein the magnetic field is a field within the range of 9 Gauss and 11 Gauss.

4. The method of any previous embodiment, wherein detection of the geometric phase shifts comprises: exposing the diamond sensor to 532 nm pump light; applying a first π/2 microwave pulse to the diamond sensor; allowing spins to precess for a time; and applying a second π/2 microwave pulse.

5. The method of any previous embodiment, wherein reading of phase shifts comprises monitoring transmission of infrared light tuned to 1042 nm transition between singlet levels.

6. The method of any previous embodiment, wherein reading of phase shifts comprises: illuminating the diamond with a 532-nm pump light; and monitoring fluorescence of the diamond over time.

7. A method of inertial sensing, comprising: (a) providing a diamond sensor with a plurality of nitrogen-vacancy centers; (b) exposing the diamond sensor to a magnetic field; (c) illuminating the diamond sensor in the magnetic field with a 532-nm light; (d) applying a first radio frequency pulse at a hyperfine transition frequency initiating the sensor to a state sensitive to rotations; (e) rotating the diamond sensor to acquire geometric phase shifts; (f) applying a second radio frequency pulse at a hyperfine transition frequency to convert the sensor to a state that can be optically probed; and (g) reading nuclear spin states.

8. The method of any previous embodiment, wherein the diamond sensor has nitrogen-vacancy centers with a concentration of between 10 and 200 vacancies per million carbon atoms.

9. The method of any previous embodiment, wherein the magnetic field exposure comprises: exposing the diamond sensor to a field between 400 Gauss and 600 Gauss; and reducing the magnetic field to 10 Gauss before applying the first radio frequency.

10. The method of any previous embodiment, further comprising ceasing illumination of the diamond sensor before applying the first radio frequency.

11. The method of any previous embodiment, wherein the first radio frequency pulse is a π/2 pulse resonantly tuned to the hyperfrequency of 5.1 MHz.

12. The method of any previous embodiment, wherein the second radio frequency pulse is a π/2 pulse resonantly tuned to the hyperfrequency of 5.1 MHz.

13. The method of any previous embodiment, wherein the reading of nuclear spin states comprises: applying microwave radiation tuned to a $^{14}$N hyperfine transition; illuminating the diamond with a 532-nm light; and analyzing fluorescence emitted from the diamond.

14. The method of any previous embodiment, wherein the reading of nuclear spin states comprises: applying microwave radiation tuned to a $^{14}$N hyperfine transition; illuminating the diamond with a 532-nm light; and analyzing infrared absorption of the diamond.

15. The method of any previous embodiment, wherein the nuclear spin states are detected by Optically Detected Magnetic Resonance (ODMR) spectroscopy.

16. A solid state gyroscope apparatus, comprising: a diamond with a plurality of nitrogen-vacancy centers on a spindle; a 532-nm light source configured to expose the diamond to light; a magnetic field source configured to expose the diamond to a magnetic field; a microwave radiation source configured to expose the diamond to microwave radiation; and a detector.

17. The apparatus of any previous embodiment, wherein the light source comprises a laser light source.

18. The apparatus of any previous embodiment, further comprising a focusing mirror disposed between the diamond and the light source and the detector.

19. The apparatus of any previous embodiment, wherein the magnetic field source comprises magnetic coils capable of producing magnetic fields from 10 Gauss to 600 Gauss.

20. The apparatus of any previous embodiment, wherein the detector comprises a fluorescence detector.

21. The apparatus of any previous embodiment, wherein said detector comprises an infrared absorption detector.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A method of inertial sensing, comprising:
   (a) providing a diamond sensor with a plurality of nitrogen-vacancy centers;
   (b) exposing the diamond sensor to a magnetic field along nitrogen-vacancy center axes;
   (c) rotating the diamond sensor to generate geometric phase shifts in the nitrogen-vacancy centers;
   (d) detecting the geometric phase shifts; and
   (e) reading information from the geometric phase shifts.

2. A method as recited in claim 1, wherein said diamond sensor has nitrogen-vacancy centers with a concentration of between 10 and 200 vacancies per million carbon atoms.

3. A method as recited in claim 1, wherein said magnetic field is a field within the range of 9 Gauss and 11 Gauss.

4. A method as recited in claim 1, wherein detection of said geometric phase shifts comprises:
   exposing the diamond sensor to 532 nm pump light;
   applying a first π/2 microwave pulse to the diamond sensor;
   allowing spins to precess for a time; and
   applying a second π/2 microwave pulse.

5. A method as recited in claim 1, wherein said reading of phase shifts comprises monitoring transmission of infrared light tuned to 1042 nm transition between singlet levels.

6. A method as recited in claim 1, wherein said reading of phase shifts comprises:
   illuminating the diamond with a 532-nm pump light; and
   monitoring fluorescence of the diamond over time.

7. A method of inertial sensing, comprising:
   (a) providing a diamond sensor with a plurality of nitrogen-vacancy centers;
   (b) exposing the diamond sensor to a magnetic field;
   (c) illuminating the diamond sensor in the magnetic field with a 532-nm light;
   (d) applying a first radio frequency pulse at a hyperfine transition frequency initiating the sensor to a state sensitive to rotations;
   (e) rotating the diamond sensor to generate geometric phase shifts;
   (f) applying a second radio frequency pulse at a hyperfine transition frequency to convert the sensor to a state that can be optically probed; and
   (g) reading nuclear spin states.

8. A method as recited in claim 7, wherein said diamond sensor has nitrogen-vacancy centers with a concentration of between 10 and 200 vacancies per million carbon atoms.

9. A method as recited in claim 7, wherein said magnetic field exposure comprises:
   exposing the diamond sensor to a field between 400 Gauss and 600 Gauss; and
   reducing the magnetic field to 10 Gauss before applying the first radio frequency.

10. A method as recited in claim 9, further comprising ceasing illumination of the diamond sensor before applying the first radio frequency.

11. A method as recited in claim 7, wherein said first radio frequency pulse is a π/2 pulse resonantly tuned to the hyperfrequency of 5.1 MHz.

12. A method as recited in claim 7, wherein said second radio frequency pulse is a π/2 pulse resonantly tuned to the hyperfrequency of 5.1 MHz.

13. A method as recited in claim 7, wherein said reading of nuclear spin states comprises:
applying microwave radiation tuned to a 14 N hyperfine transition;
illuminating the diamond with a 532-nm light; and
analyzing fluorescence emitted from the diamond.

14. A method as recited in claim 7, wherein said reading of nuclear spin states comprises:
applying microwave radiation tuned to a 14 N hyperfine transition;
illuminating the diamond with a 532-nm light; and
analyzing infrared absorption of the diamond.

15. A method as recited in claim 7, wherein the nuclear spin states are detected by Optically Detected Magnetic Resonance (ODMR) spectroscopy.

16. A solid state gyroscope apparatus, comprising:
a diamond with a plurality of nitrogen-vacancy centers on a spindle;
a 532-nm light source configured to expose the diamond to light;
a magnetic field source configured to expose the diamond to a magnetic field;
a microwave radiation source configured to expose the diamond to microwave radiation; and
a detector.

17. An apparatus as recited in claim 16, wherein said light source comprises a laser light source.

18. An apparatus as recited in claim 16, further comprising a focusing mirror disposed between the diamond and the light source and the detector.

19. An apparatus as recited in claim 16, wherein said magnetic field source comprises magnetic coils capable of producing magnetic fields from 10 Gauss to 600 Gauss.

20. An apparatus as recited in claim 16, wherein said detector comprises a fluorescence detector.

21. An apparatus as recited in claim 16, wherein said detector comprises an infrared absorption detector.

* * * * *